US009589827B2

United States Patent
Cheng et al.

(10) Patent No.: US 9,589,827 B2
(45) Date of Patent: Mar. 7, 2017

(54) SHALLOW TRENCH ISOLATION REGIONS MADE FROM CRYSTALLINE OXIDES

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US); Charan V. V. S. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 14/305,502

(22) Filed: Jun. 16, 2014

(65) Prior Publication Data
US 2015/0364361 A1    Dec. 17, 2015

(51) Int. Cl.
| | |
|---|---|
| *H01L 21/762* | (2006.01) |
| *H01L 21/02* | (2006.01) |
| *H01L 29/06* | (2006.01) |
| *H01L 21/8234* | (2006.01) |

(52) U.S. Cl.
CPC .... *H01L 21/76224* (2013.01); *H01L 21/0242* (2013.01); *H01L 21/76229* (2013.01); *H01L 21/76232* (2013.01); *H01L 21/76297* (2013.01); *H01L 21/823481* (2013.01); *H01L 29/0642* (2013.01); *H01L 21/02293* (2013.01)

(58) Field of Classification Search
CPC ......... H01L 21/76224; H01L 21/76229; H01L 21/0242; H01L 21/823481; H01L 21/76232; H01L 21/76297; H01L 29/0642; H01L 21/02293
See application file for complete search history.

(56) References Cited

U.S. PATENT DOCUMENTS

| | | | |
|---|---|---|---|
| 6,504,214 B1 * | 1/2003 | Yu | H01L 21/28194 257/347 |
| 6,610,548 B1 | 8/2003 | Ami et al. | |
| 6,852,575 B2 | 2/2005 | Bojarczuk, Jr. et al. | |
| 7,135,699 B1 | 11/2006 | Atanackovic | |
| 8,546,857 B1 | 10/2013 | Wang et al. | |
| 2012/0086059 A1 * | 4/2012 | Dubourdieu | H01L 21/28291 257/295 |
| 2013/0154007 A1 | 6/2013 | Cheng et al. | |
| 2013/0207226 A1 | 8/2013 | Adam et al. | |
| 2013/0228893 A1 * | 9/2013 | Zhong | H01L 21/76232 257/506 |
| 2013/0240958 A1 | 9/2013 | Wang et al. | |
| 2014/0312425 A1 * | 10/2014 | Adam | H01L 29/66795 257/352 |

OTHER PUBLICATIONS

List of IBM Patents or Patent Applications Treated as Related dated Oct. 7, 2016, 2 pages.

* cited by examiner

*Primary Examiner* — Michael Trinh
(74) *Attorney, Agent, or Firm* — Scully, Scott, Murphy & Presser, P.C.

(57) ABSTRACT

A method of manufacturing a semiconductor device that involves etching a trench in a semiconductor substrate, epitaxially growing a crystalline structure in the trench and forming semiconductor structures on either side of the crystalline structure. Crystalline oxides may include rare earth oxides, aluminum oxides or Perovskites.

10 Claims, 3 Drawing Sheets

SHALLOW TRENCH ISOLATION REGIONS MADE FROM CRYSTALLINE OXIDES

BACKGROUND

The present invention relates to manufacturing semiconductor devices, particularly with methods of forming shallow trench isolation regions.

Shallow trench isolation may be common practice in, for example, semiconductor devices below 250 nm. Shallow trench isolation removes a portion of a semiconductor substrate and replaces it with an insulator such as, for example, Silicon Oxide, Silicon Nitride and Silicon Oxynitride. The structure that results may, among other things, prevent current leakage between devices on a chip.

BRIEF SUMMARY

An embodiment of the invention may include a method of forming a semiconductor device. The method involves etching a trench into a semiconductor substrate. The entire volume of the trench is then filled with a crystalline oxide to from an epitaxial oxide structure. Following formation of the epitaxial oxide structure, a first semiconductor structure and a second semiconductor structure are formed on opposite sides of the epitaxial oxide structure.

An additional embodiment of the invention may include a semiconductor device. The semiconductor device may include a first semiconductor structure and a second semiconductor structure on a semiconductor substrate. The semiconductor device may contain a crystalline oxide layer located between the first semiconductor structure and the second semiconductor structure. The crystalline oxide layer may have a top surface substantially planar to the top surface of the semiconductor substrate, and extend below the surface of the semiconductor substrate.

BRIEF DESCRIPTION OF THE SEVERAL DRAWINGS

Figure 1:
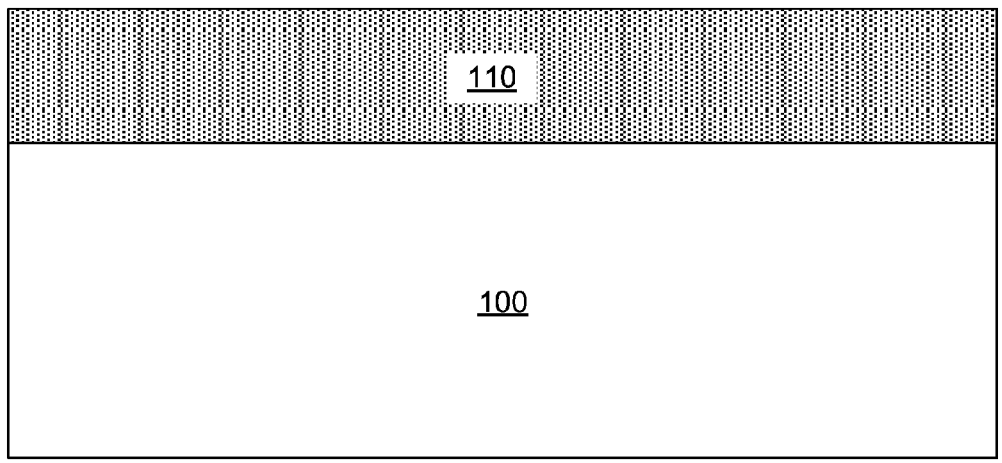
FIG. 1 is a cross-sectional view depicting a substrate and a nitride layer, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

During the formation of various semiconductor structures, addition and removal of many material layers may occur to form the desired structure. Some removal processes may include a chemical wetstripping that uses a reactive material to selectively remove a layer, or a portion of a layer, to create the desired structure. However, wetstripping may also remove or damage more permanent structures, such as isolation trenches that are located between the semiconductor structures on a device. It may be advantageous to form the isolation structures with materials that are more resistant to wet etching, such as crystalline rare earth oxides and Perovskites, instead of the silicon oxide, silicon nitride or silicon oxynitride materials that have traditionally been used.

Referring to FIG. 1, a substrate 100 with a nitride layer 110 may be provided. The substrate 100 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In some embodiments, the substrate 100 may be a bulk semiconductor substrate. In such embodiments, the substrate 100 may be approximately, but is not limited to, several hundred microns thick. For example, the substrate 100 may have a thickness ranging from approximately 0.5 mm to approximately 1.5 mm. In other embodiments the substrate 100 may be a semiconductor-on-insulator (SOI) substrate, where a buried insulator layer (not shown) separates a base substrate (not shown) from a top semiconductor layer.

Still referring to FIG. 1, the nitride layer 110 may be deposited above the substrate 100. The nitride layer 110 is intended to protect the substrate 100 during etching and the subsequent epitaxial growth. The nitride layer 110 may be made from any of several known nitrides or oxides such as, for example, silicon nitride. In such embodiments, the nitride layer 110 may have any thickness capable of protecting the substrate 100, for example thickness ranging from, but not limited to, approximately 10 nm to approximately 400 nm. Deposition of the nitride layer 110 may be performed by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

In some embodiments, an oxide layer (not shown) may be provided above the nitride layer. The oxide layer may be made from any of several known oxides or oxynitrides derived from a silicon. For example, the oxide layer may be made of silicon oxide or silicon oxynitride. The oxide layer may have a thickness, for example, ranging from approximately 1 nm to approximately 1000 nm, preferably ranging from approximately 10 nm to approximately 250 nm. However, greater and lesser thicknesses of the oxide layer are explicitly contemplated.

Figure 2:
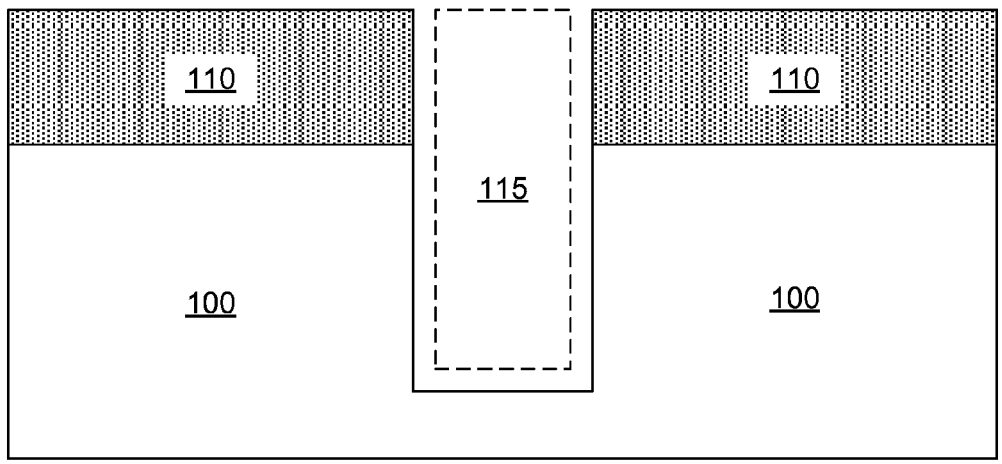
FIG. 2 is a cross-sectional view depicting a formation of a trench, according to an exemplary embodiment.

Referring to FIG. 2, a trench 115 may be formed in the substrate 100 and the nitride layer 110 through lithographic patterning and etching of the material. The trench 115 may be created with a thickness and depth to reduce current leakage across the trench 115 once it has been filled with a dielectric material. The trench 115 may be formed using a photolithography process followed by an anisotropic etching process such as reactive ion etching (RIE) or plasma etching.

Figure 3:
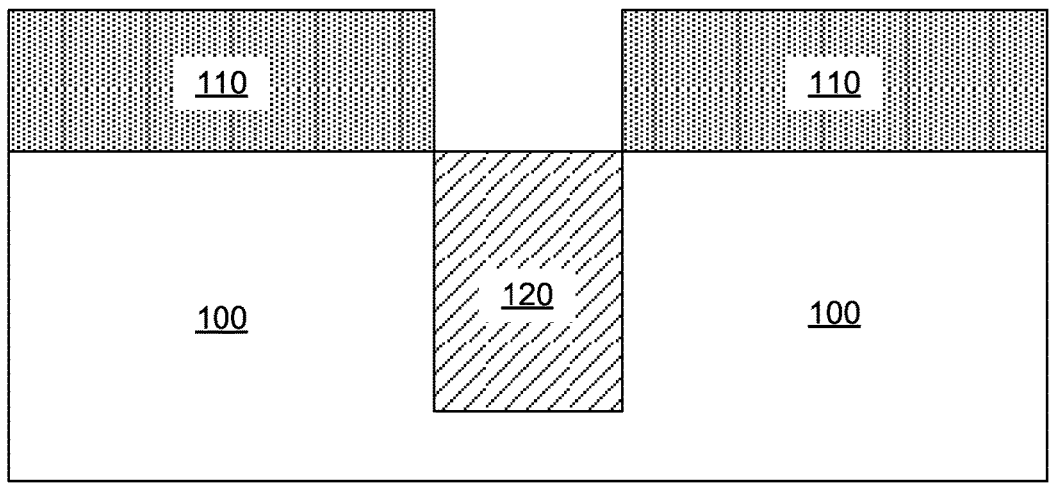
FIG. 3 is a cross-sectional view depicting forming a crystalline oxide layer, according to an exemplary embodiment.

Referring to FIG. 3, a crystalline oxide layer 120 may be epitaxially grown in the trench 115. After formation of the crystalline oxide layer 120, the lattice of the crystalline oxide layer 120 corresponds to the lattice exhibited by the material of the substrate 100. In an exemplary embodiment, epitaxial growth may be halted once the crystalline oxide layer 120 substantially fills the trench 115, so that the surface of crystalline oxide layer 120 is substantially level with the surface of the substrate 100 (FIG. 2). In other exemplary embodiments (not shown), the epitaxial oxide layer may be deposited in the trench 115, and above nitride layer 110, and recessed through chemical mechanical planarization (CMP).

Exemplary epitaxial oxide materials grown in the trench 115 include rare earth oxides (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$)). In some embodiments, the crystalline oxide layer 120 includes combinations of rare earth oxides (e.g., a material such as $ABO_3$, where 'A' and 'B' may be any rare earth metal (e.g., lanthanum scandium oxide ($LaScO_3$)). In yet another embodiment, the crystalline oxide layer 120 may include aluminum oxide $Al_2O_3$ or aluminum oxide compounds (e.g., lanthanum aluminum $LaAlO_3$). In yet other embodiments, the crystalline oxide layer 120 includes Perovskites (e.g. strontium titanate ($SrTiO_3$) or barium titanate ($BaTiO_3$)) which may be deposited by pulsed laser deposition (PLD)). It is understood that the descriptions of crystalline oxide layers provided herein are for illustrative purposes, and that other crystalline oxide layers or layer combinations may be used in accordance with other embodiments.

Examples of various epitaxial growth process apparatuses that may be suitable for use in forming the crystalline oxide layer 120 may include, for example, molecular beam epitaxy (MBE), rapid thermal chemical vapor deposition (RTCVD), low-energy plasma deposition (LEPD), ultra-high vacuum chemical vapor deposition (UHVCVD), and atmospheric pressure chemical vapor deposition (APCVD).

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth processes or apparatuses that are suitable for use in forming the epitaxial oxide of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

Figure 4:
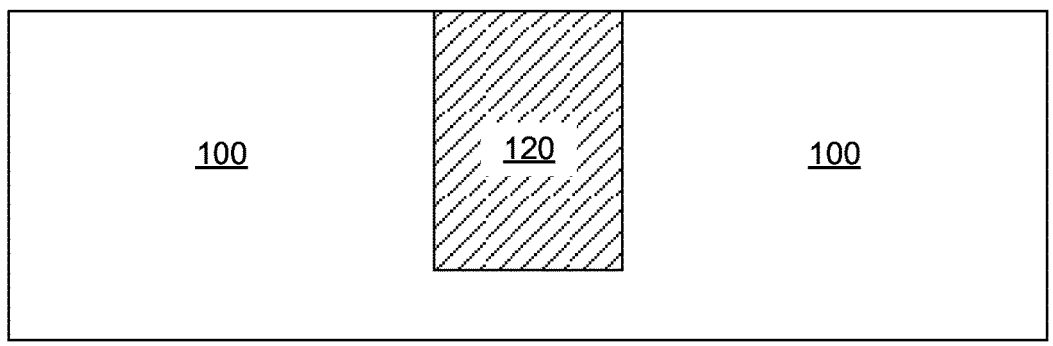
FIG. 4 is a cross-sectional view depicting removing the nitride layer, according to an exemplary embodiment.

Referring to FIG. 4, removal of the nitride layer 110 may be performed. Removal of the nitride layer may be accomplished through any combination of known techniques, such as, for example, RIE, wet stripping and plasma etching.

Figure 5:
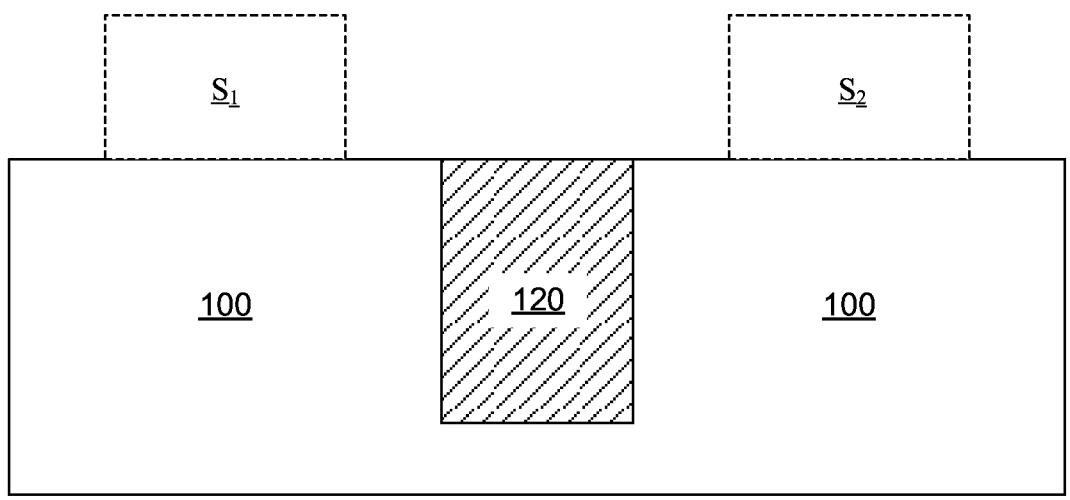
FIG. 5 is a cross-sectional view depicting forming semiconductor structures, according to an exemplary embodiment.

Referring to FIG. 5, various semiconductor structures, $S_1$ and $S_2$, may be formed on the substrate 100. The semiconductor structures are placed on opposite sides of the crystalline oxide layer 120, which may reduce current leakage from one structure to another. Formation of the semiconductor structures, $S_1$ and $S_2$, may be done through any number of techniques, such as deposition and etching of additional layers, removal of portions of the substrate 100 followed by deposition of different materials, or any other methods known in the art. Such techniques may result in the formation of, for example, Field Effect Transistors (FET), photodetectors, resistors, capacitors, etc.

Following the formation of the semiconductor structures, $S_1$ and $S_2$, the semiconductor device may have identical, or different, devices located on the substrate 100. These devices may be separated by a trench in the substrate 100 containing the crystalline oxide layer 120 made of a rare earth oxide or perovskite material. The surface of the crystalline oxide layer 120 may be substantially planar with the surface of the substrate 100, and extends to a depth below the surface necessary to adequately reduce current leakage of the semiconductor structure $S_1$ to the semiconductor structure $S_2$. The crystalline oxide layer 120 is encompassed by substrate 100, except for the surface of the crystalline oxide layer 120, which remains exposed to the atmosphere during, and just after, the formation of the semiconductor structures, $S_1$ and $S_2$.

The use of a crystalline oxide insulator in shallow trench isolation (STI) regions prior to the formation of the semiconductor structures may create a structure that is more capable than previous insulator materials (e.g. silicon oxides, silicon nitrides, and silicon oxynitrides) to withstand the chemical etching steps that are involved in the formation of semiconductors. For example, a typical step of creating a desired pattern of a material on a substrate may include deposition of a material, depositing a silicon oxide or silicon nitride material above the material to mask the material or act as a surface for a photolithographic layer to adhere to, using photolithography to etch the desired pattern, and then removal of any remaining silicon oxide or silicon nitride material. During the removal or etching process, chemical etchants, such as Hydrofluoric acid or buffered hydrofluoric acid, are used to remove silicon oxides which may create partial removal of the material, roughness of the surface of the STI region or an uneven topography of an STI region made from the previous insulator materials. Also epitaxial preclean and silicide preclean, which are tailored to remove residual or native silicon oxide before deposition of epitaxy or contact metal may inadvertently effect or damage the STI. Those cleans are done by HF or by plasma assisted chemical dry etch. However, chemical etchants, such as Hydrofluoric acid, may not react as readily with epitaxial oxides as they do with the previous insulator materials, and therefore the use of crystalline oxides in STI regions may create a structure that is less susceptible to damage than STI regions made with the previous insulator materials.

By replacing traditional oxide materials used in STI formation with epitaxial oxides, unwanted etching of the STI region may be avoided. This may lead to devices where isolation is increased, final devices with a flatter topography and reduction of unwanted epitaxial growth at the edges of the STI region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure comprising:
    providing a semiconductor substrate;
    forming a nitride layer on said substrate;
    etching a trench into said semiconductor substrate, wherein said trench is formed in said nitride layer and said substrate;
    forming an epitaxial oxide structure by growing a crystalline oxide layer in a portion of said trench located below a bottommost surface of said nitride layer, wherein the crystalline oxide layer fills an entire volume of the trench located below a topmost planar surface of said substrate;
    removing said nitride layer; and
    forming a first semiconductor structure and a second semiconductor structure on the semiconductor substrate, wherein the epitaxial oxide structure is located between the first semiconductor structure and the second semiconductor structure.

2. The method of claim 1, wherein the crystalline oxide comprises rare earth oxides.

3. The method of claim 2, wherein the rare earth oxide is selected from the group consisting of cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$).

4. The method of claim 1, wherein the crystalline oxide comprises a combination of rare earth oxides.

5. The method of claim 4, wherein the combination of rare earth oxides is a binary oxide having the chemical formula $ABO_3$, wherein A is a rare earth metal atom and B is a different rare earth metal atom.

6. The method of claim 1, wherein the crystalline oxide comprises a perovskite material.

7. The method of claim 6, wherein the perovskite material is selected from the group consisting of strontium titanate ($SrTiO_3$) and barium titanate ($BaTiO_3$).

8. The method of claim 1, wherein the crystalline oxide is aluminum oxide ($Al_2O_3$) or an aluminum oxide compound.

9. The method of claim 1, wherein said crystalline oxide layer is formed selectively on said semiconductor surface.

10. The method of claim 9, wherein said crystalline oxide layer is not formed on said nitride layer.

* * * * *